(12) United States Patent
Cobb

(10) Patent No.: US 7,324,930 B2
(45) Date of Patent: Jan. 29, 2008

(54) METHOD AND APPARATUS FOR PERFORMING OPC USING MODEL CURVATURE

(76) Inventor: Nicolas B. Cobb, 1496 Flamingo Way, Sunnyvale, CA (US) 94087

( * ) Notice: Subject to any disclaimer, the term of this patent is extended or adjusted under 35 U.S.C. 154(b) by 622 days.

(21) Appl. No.: 10/696,276

(22) Filed: Oct. 29, 2003

(65) Prior Publication Data

US 2004/0088149 A1 May 6, 2004

Related U.S. Application Data

(63) Continuation-in-part of application No. 09/457,410, filed on Dec. 7, 1999, now Pat. No. 6,643,616.

(51) Int. Cl.
G06G 7/62 (2006.01)
G06F 17/50 (2006.01)
G03F 1/00 (2006.01)

(52) U.S. Cl. .................. 703/13; 716/19; 716/21; 430/5

(58) Field of Classification Search ............ 703/13
See application file for complete search history.

(56) References Cited

U.S. PATENT DOCUMENTS

| | | | |
|---|---|---|---|
| 5,815,685 A * | 9/1998 | Kamon ............... | 716/21 |
| 5,825,647 A | 10/1998 | Tsudaka | |
| 6,033,814 A | 3/2000 | Burdorf et al. | |
| 6,080,527 A | 6/2000 | Huang et al. | |
| 6,120,952 A | 9/2000 | Pierrat et al. | |
| 6,226,781 B1 | 5/2001 | Nistler et al. | |
| 6,249,904 B1 | 6/2001 | Cobb | |
| 6,263,299 B1 * | 7/2001 | Aleshin et al. ............ | 703/5 |
| 6,269,472 B1 | 7/2001 | Garza et al. | |
| 6,301,697 B1 | 10/2001 | Cobb | |
| 6,312,854 B1 | 11/2001 | Chen et al. | |
| 6,370,679 B1 | 4/2002 | Chang et al. | |
| 6,649,309 B2 * | 11/2003 | Mukherjee ............... | 430/5 |
| 2005/0278686 A1 * | 12/2005 | Word et al. ............ | 716/21 |

OTHER PUBLICATIONS

Cobb, N., and A. Zakhor, "Fast, Low-Complexity Mask Design," Proceedings of SPIE, vol. 2440: Symposium on Optical/Laser Microlithography VIII, Santa Clara, Calif., Feb. 22-24, 1995, pp. 313-327.*

Vacca, A., et al., "Techniques to detect and analyze photomask CD uniformity errors," *Proceedings of SPIE, 19th Annual Symposium on Photomask Technology*, Paper 3873-21, pp. 209-214, 1999.

(Continued)

*Primary Examiner*—Paul Rodriguez
*Assistant Examiner*—Juan Carlos Ochoa
(74) *Attorney, Agent, or Firm*—Klarquist Sparkman, LLP

(57) ABSTRACT

A method of preparing a file that stores layout of devices to be created with photolithography for optical and process correction (OPC). Polygons that define structures to be created are initially fragmented into edge segments and a simulation of how the edge segments will be printed under process conditions is performed. The results of the simulation are used to adjust/refragment the edge segments. In one embodiment, the curvature of light intensity at the edge segments is used to adjust the fragmentation of the polygons.

6 Claims, 10 Drawing Sheets

OTHER PUBLICATIONS

Cobb, N., et al., "Experimental Results on Optical Proximity Correction with Variable Threshold Resist Model," *Optical Microlithography X, The International Society for Optical Engineering 3051*:458-468, Mar. 1997.

Cobb, N.B., "Fast Optical and Process Proximity Correction Algorithms for Integrated Circuit Manufacturing," Ph.D. dissertation, University of California at Berkeley, Spring 1988, pp. 64-71.

Cobb, N., et al., "Mathematical and CAD Framework for Proximity Correction," *Optical Microlithography IX, The International Society for Optical Engineering 2726*: 208-222, Mar. 1996.

Benchmark Technologies, OPC Reference Standard (JIIIA) Reticle, Oct. 12, 1999.

"Resolution Enhancement Technologies (OPC/PSM)," Jul. 16, 2002, Mentor Graphics Internet Site, Technical Papers.

Randall, J., et al., "Lithography Simulation With Aerial Image—Variable Threshold Resist Model," *International Conference on Micro and Nano Engineering 46*:59-60, Sep. 1998.

Rieger, M.L. and J.P. Stirniman, "Using Behavior Modeling for Proximity Correction," *SPIE Proceedings, The International Society for Optical Engineering, Optical/Laser Microlithography VII 2197*:371-376, May 1994.

Schellenberg, F.M., et al., "SEMATECH JIII Project: OPC Validation," *SPIE Proceedings, Optical Microlithography XI 3334*:892-911, 1998.

Schellenberg, F.M., "Design for Manufacturing in the Semiconductor Industry: The Litho/Design Workshops," *Proceedings of the 12th Int'l. Conference on VLSI Design*, Jan. 10-13, 1999, pp. 111-119.

Schellenberg, F.M., "Sub-Wavelength Lithography Using OPC," *Semiconductor Fabtech*, 9th ed., Mar. 1999.

Spence, C., et al., "Integration of Optical Proximity Correction Strategies in Strong Phase Shifters Design for Poly-Gate Layers," *SPIE Proceedings, 19th Annual Symposium of Photomask Technology 3873*:277-287, 1999.

Stirniman, J.P. and M.L. Rieger, "Optimizing Proximity Correction for Wafer Fabrication Processes," *Proc. SPIE, 14th Annual BACUS Symposium on Photomask Technology and Management 2322*:239-246, Dec. 1994.

Washington, A., *Basic Technical Mathematics with Calculus*, 2d ed., 1970, pp. 245-247, 260-262, 505-525.

* cited by examiner

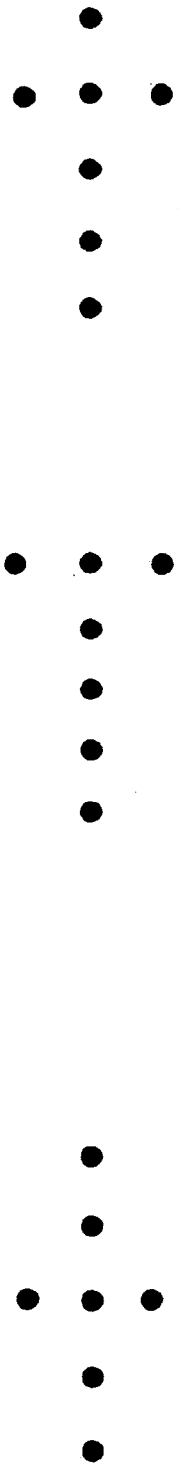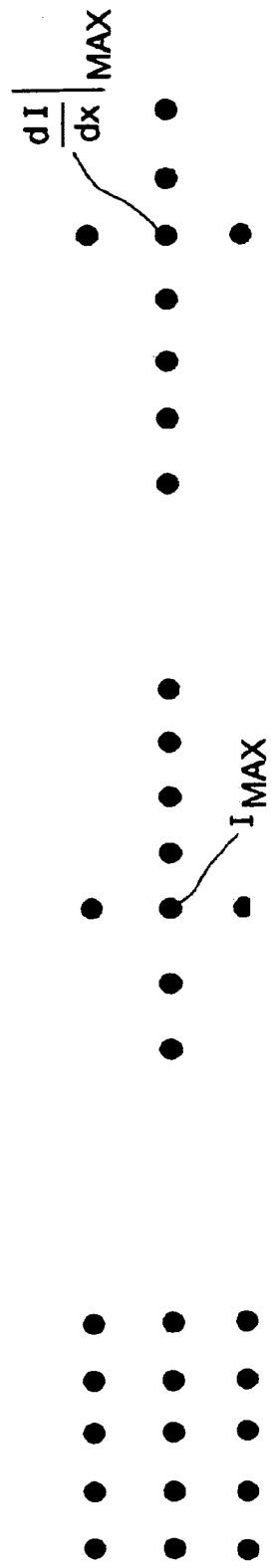

METHOD AND APPARATUS FOR PERFORMING OPC USING MODEL CURVATURE

CROSS-REFERENCE TO RELATED APPLICATION

The present application is a continuation-in-part of U.S. patent application Ser. No. 09/457,410 (now U.S. Pat No. 6,643,616), filed Dec. 7, 1999, and issued Nov. 4, 2003, the benefit of which is claimed under 35 U.S.C. § 120.

FIELD OF THE INVENTION

The invention relates to structure modeling and prediction. More specifically, the invention relates to methods of enhancing the manufacturability of a physical structure, such as an integrated circuit, based on information derived from contour representations.

BACKGROUND OF THE INVENTION

As integrated circuits (ICs) become more dense, the widths of lines and components, as well as the separation between lines becomes increasingly smaller. Currently, deep sub-micron (<0.25 μm) processes are being used. However, with deep sub-micron processes, silicon yield is affected by several factors including reticle/mask pattern fidelity, optical proximity effects, and diffusion and loading effects during resist and etch processing. Typical problems include linewidth variations that depend on local pattern density and topology and line end pullback.

Optical and process correction (OPC) can be used to improve image fidelity. Optical proximity correction is a subset of optical and process correction. OPC techniques include, for example, introduction of additional structures to the IC layout that compensate for various process distortions. Two general categories of OPC are currently in use: rule-based OPC and model-based OPC. In rule-based OPC, a reticle layout is modified according to a set of fixed rules for geometric manipulation. However, rule-based OPC has limited capability and when more complex OPC is desired, model-based OPC is used.

In model-based OPC, an IC structure to be formed is modeled and a threshold that represents the boundary of the structure on the wafer can be determined from simulated results generated based on the model used. Simple forms of model-based OPC generate a simulated aerial image, I(x,y), having a threshold, $I_{th}$, to predict the structure to be manufactured.

A more sophisticated and accurate model-based OPC technique, referred to as the Variable Threshold Resist (VTR) model, allows the threshold, $I_{th}$, to take on multiple values. The VTR model is described by Cobb, et al., "Mathematical and CAD Framework for Proximity Correction," *Optical Microlithography IX, Proc. SPIE* 2726, pp. 208-222 (1996); Cobb, et al., "Experimental Results in Optical Proximity Correction with Variable Threshold Resist Model," *Optical Microlithography X, SPIE* 3051, pp. 458-468 (1998); and Nicholas B. Cobb, "Fast Optical and Process Proximity Correction Algorithms for Integrated Circuit Manufacturing," Ph.D. dissertation, Univ. Cal. Berkeley (1998).

FIG. 1 is one embodiment of contours representing an integrated circuit line end based on a Variable Threshold Resist (VTR) model. In general, the VTR model is used to determine characteristics of the integrated circuit structure where the threshold, $$I_{th} = f\left(I_{max}, \left.\frac{\partial I}{\partial x}\right|_{max}\right),$$

is a function of two variables, maximum intensity, $I_{max}$, and maximum slope, $$\left.\frac{\partial I}{\partial x}\right|_{max},$$

as measured along a one-dimensional cut-line through the x-axis of the simulated result. As illustrated in FIG. 1, the x-axis orientation is parallel to one of the axes used in the integrated circuit layout. The slope determined from the simulated result can be used to modify the design of the integrated circuit.

The VTR model has been used to provide improved IC manufacturing; there is a continual need to improve the accuracy and speed with which OPC can improve the manufacturability of objects to be created with a photolithographic process.

SUMMARY OF THE INVENTION

The present invention is a method and apparatus for preparing a file that enhances the manufacturability of a structure to be created using photolithography. A structure to be created by the photolithographic process is initially defined as a sequence of vertices that make up a closed polygon. Each polygon is initially fragmented into a series of edge segments. In accordance with one embodiment of the invention, a curvature of light intensity or other parameter process is estimated in a region near an edge segment and the fragmentation of the polygon adjusted as a function of the simulated parameter. In one particular embodiment, additional edge segments are added in areas of high light intensity curvature and edge segments are removed in areas of low light intensity curvature.

BRIEF DESCRIPTION OF THE DRAWINGS

The invention is illustrated by way of example, and not by way of limitation in the figures of the accompanying drawings in which like reference numerals refer to similar elements.

FIGS. 4A-4F illustrate exemplary sampling patterns suitable for use with the invention.

DETAILED DESCRIPTION OF THE PREFERRED EMBODIMENT

Figure 1:
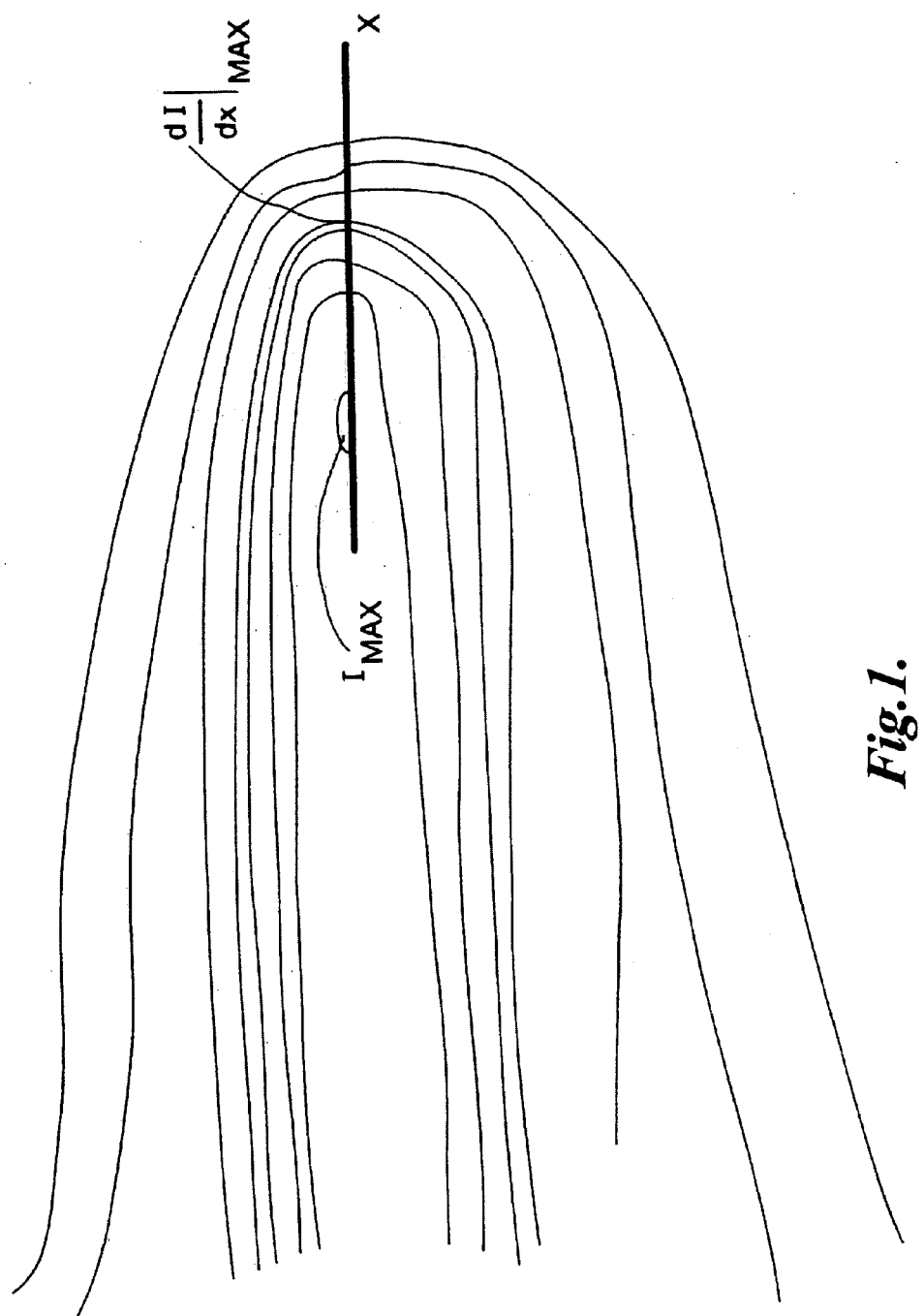
FIG. 1 is one embodiment of contours representing an integrated circuit line end based on a Variable Threshold Resist (VTR) model.

Methods and apparatuses for structure prediction based on model curvature are described. In the following description, for purposes of explanation, numerous specific details are set forth in order to provide a thorough understanding of the invention. It will be apparent, however, to one skilled in the art that the invention can be practiced without these specific details. In other instances, structures and devices are shown in block diagram form in order to avoid obscuring the invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art.

An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The invention also relates to apparatuses for performing the operations herein. These apparatuses may be specially constructed for the required purposes, or may comprise a general purpose computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

Briefly, a simulation result corresponding to an integrated circuit or other structure is generated. The result includes contour data representing a feature value, for example, height (or intensity) of the structure at various points. Three or more points are used to determine a curvature of the result at a predetermined location. The curvature information can be used to determine boundaries of the structure. For example, when used with an integrated circuit layout, the curvature can be used for optical and process correction (OPC) purposes to modify an integrated circuit layout such that the resulting integrated circuit more closely resembles the designed integrated circuit than would otherwise be possible. In one embodiment, both slope and curvature of the integrated circuit structure are used for OPC purposes.

Figure 2:
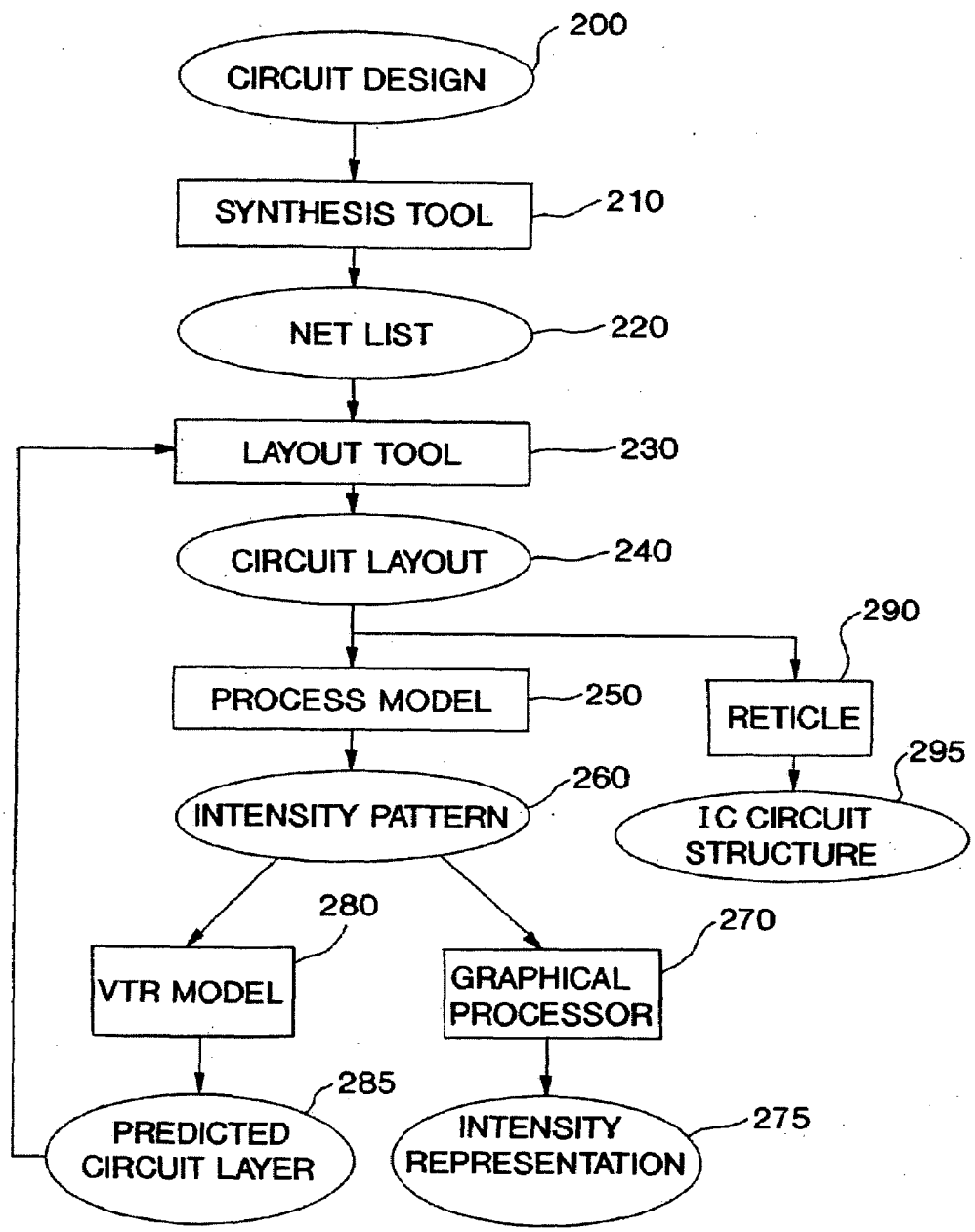
FIG. 2 represents one embodiment of an integrated circuit layer prediction process suitable for use with the invention.

FIG. 2 represents one embodiment of an integrated circuit layer prediction process suitable for use with the invention. In general, the process described with respect to FIG. 2 generates a predicted circuit layer from a circuit design. The predicted circuit layer can be used for OPC purposes. The process can be used for multiple layers of an integrated circuit design.

Circuit design 200 represents a circuit described in functional, rather than physical, terms. In one embodiment, circuit design 200 is a high-level integrated circuit (IC) description language such as VHDL and Verilog®, which are commonly used to design circuits. One embodiment of VHDL is described in greater detail in "IEEE Standard VHDL Language Reference Manual," ANSI Std. 1076-1993, published Jun. 6, 1994. One embodiment of Verilog® is described in greater detail in IEEE Standard 1364-1995. These and other high-level IC description languages allow a circuit designer to design and simulate circuits by using high-level code to describe the structure and/or behavior of the circuit being designed.

Circuit design 200 is typically input to a synthesis tool 210, which generates netlist 220. Other software tools can also be used to create netlists using customized design techniques. Netlist 220 describes the logical relationship of circuit elements to provide the desired functionality. Netlist 220 can then be used to develop the layout that will be used to fabricate an IC having the desired functionality. Netlist 220 can also be used for verification purposes.

Netlist 220 is input to layout tool 230, which can be an electronic design automation (EDA) tool, one embodiment of which is described in greater detail below, or any other tool that generates a circuit layout based on circuit design 200. Circuit layout 240 is generated by layout tool 230. Circuit layout 240 has multiple layers, determined based on circuit design 200 and the manufacturing process to be used, and can be represented in any appropriate format for describing a layout for circuit design 200. Typical layout formats include industry standards such as GDS II or OASIS.

Process model 250 receives circuit layout 240 and generates intensity pattern 260. In one embodiment, process model 250 is a mathematical model that is based on the manufacturing process to be used to manufacture an integrated circuit based on circuit design 200. The mathematical model can be performed by, for example, a computer system having a processor that executes a sequence of instructions stored in memory that represent the mathematical model. Process models are known in the art and examples of process models and/or references to process models can be found in the papers cited above in the Background of the Invention.

Process model 250 generates intensity pattern 260 for a layer of the integrated circuit, which represents the intensity of light to which the physical integrated circuit will be exposed based on information related to the manufacturing process to be used. The intensity determines the exposure, and therefore, the size and shape of the integrated circuit structure. In one embodiment, intensity pattern 260 is a mathematical representation of the integrated circuit structure stored, for example, in a machine-readable storage medium.

Graphical processor 270 operates on intensity pattern 260 to generate intensity representation 275. Graphical processor 270 and intensity representation 275 are not necessary to practice the invention; however, intensity representation 275 can be useful in circuit design and OPC. Intensity representation 275 is any physical representation of intensity pattern 260, for example, a display on a computer screen, a printed contour plot, etc. In one embodiment, intensity representation 275 illustrates the integrated circuit layer with contour lines that represent constant intensity, or constant elevation. Graphical processor 270 is any device (e.g., a computer system with a display device and/or printer) that converts intensity pattern 260 to intensity representation 275.

VTR model 280 also operates on intensity pattern 260 to generate predicted realization of the circuit layer 285. One embodiment of VTR model 280 is described in greater detail below. In one embodiment, predicted realization of the circuit layer 285 provides a threshold line, $I_{th}$, that represents a predicted boundary of the integrated circuit structure(s) on the layer processed.

In one embodiment, the threshold line, $I_{th}$, is determined taking into consideration curvature information determined as described below with respect to FIG. 3. In one embodiment, predicted realization of the circuit layer 285 also includes curvature information as discussed below.

Predicted realization of the circuit layer 285 is used to modify circuit layout 240. For example, if predicted realization of the circuit layer 285 indicates that the circuit layer will not provide an appropriate structure (e.g., line end shortening), circuit layout 240 can be modified (e.g., by extending the line end) to compensate for the deficiency. Thus, predicted realization of the circuit structure 285 can be used as feedback to provide OPC for the integrated circuit design. The layout modification and modeling process can be repeated as necessary until predicted realization of the circuit structure 285 indicates a satisfactory design.

Once a satisfactory design is achieved, the corresponding circuit layout 240 is used to generate reticle 290. Reticle 290 can be generated in any manner known in the art. Reticle 290 is used in an integrated circuit manufacturing process to manufacture integrated circuit structure 295.

Figure 3:
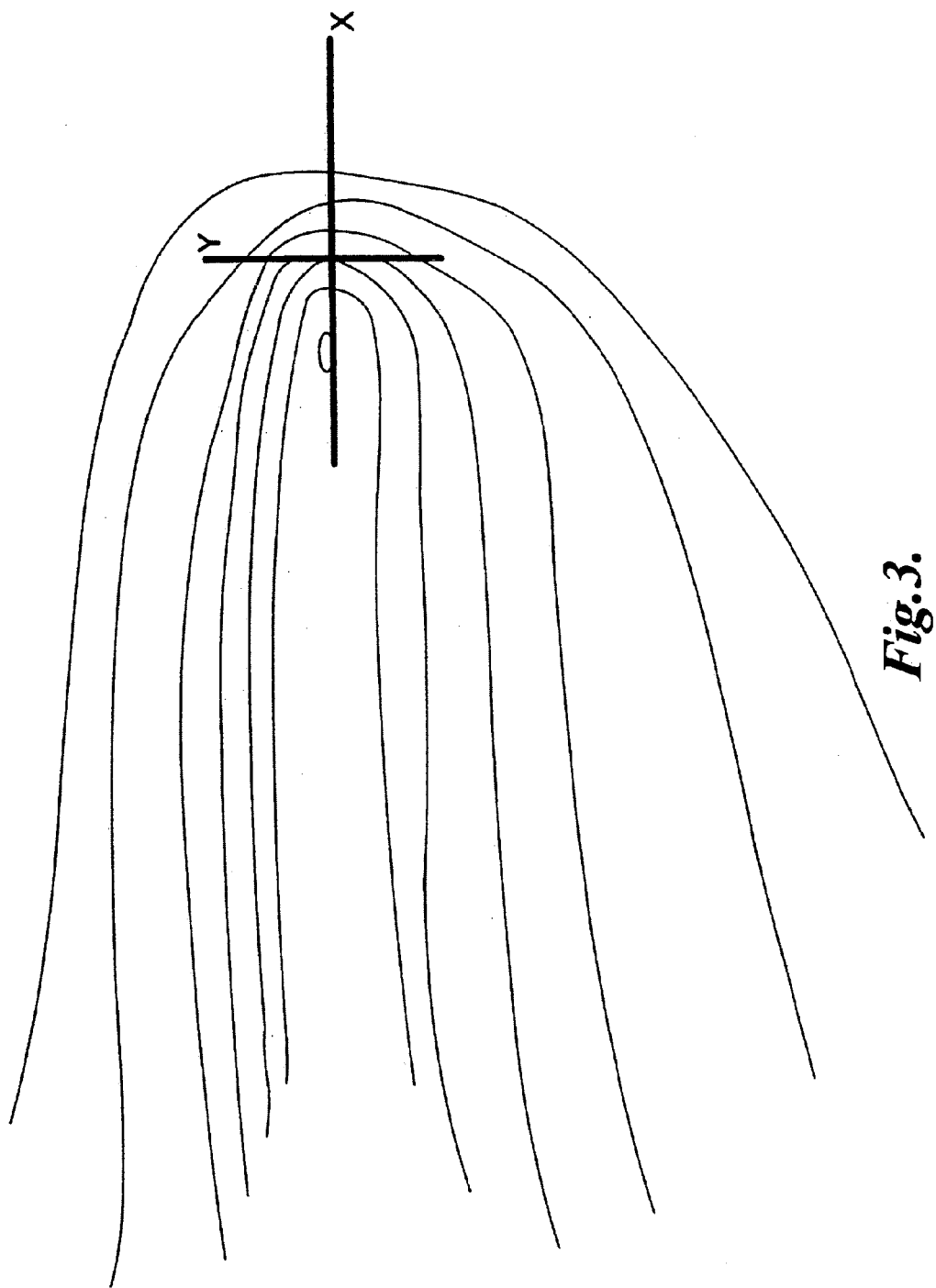
FIG. 3 illustrates one embodiment of a contour representation of a simulation result corresponding to an integrated circuit structure layout upon which curvature can be measured in a first manner.

FIG. 3 illustrates one embodiment of a contour representation of a simulation result corresponding to an integrated circuit structure layout upon which curvature can be measured in a first manner. In one embodiment, a two dimensional sampling pattern is used to determine slope of the model along the x-axis and curvature of the model along the y-axis. In an alternative embodiment, only curvature along the y-axis is measured. In another alternative embodiment, the angle between the line along which slope is determined and the line along which the curvature is determined are not perpendicular to each other.

While slope and curvature are discussed as being determined along one or more predetermined lines, the sampling points used in determining slope and/or curvature are not required to be linear. Representative integrated circuit structures are described herein with respect to x- and y-axes, which are traditionally horizontal and vertical axes, respectively; however, the slope and curvature samples can be taken along any orientation with respect to the integrated circuit structure.

In one embodiment, samples are taken at predetermined locations relative to the contour to determine slope along a first predetermined line (X) and curvature along a second predetermined line (Y). In one embodiment, slope is determined between adjacent sampling points along the first predetermined line; however, the sampling points used for determining slope are not all required to be on a common line. Similarly, in one embodiment, curvature is determined based the slope of a parabola fit to three sampling points on the second predetermined line; however, curvature can be determined in a different manner, for example, more than three points can be used, or curvature can be determined along a non-linear section.

Experience has shown that use of curvature in determining the threshold value of an integrated circuit structure provides improved information compared to using slope alone, accordingly, the number of sampling points along the slope line (X) can be decreased to compensate for the increased number of sampling points used along the curvature line (Y). Therefore, little or no performance penalty is incurred for determining both slope and curvature as compared to determining slope only. In one embodiment, seven sampling points along the slope line are used to determine slope values and three sampling points along the curvature line are used to determine curvature; however, any number of points along either line can be used to determine slope and/or curvature.

In an embodiment where slope is determined along the first predetermined line and curvature is determined along the second predetermined line, the threshold for the corresponding structure can be determined according to:

$$I_{th} = f\left(I_{max}, \left.\frac{\partial I}{\partial x}\right|_{max}, \left.\frac{\partial^2 I}{\partial y^2}\right|_{x=fixed}\right)$$

where $$\left.\frac{\partial^2 I}{\partial y^2}\right|_{x=fixed}$$

represents the curvature of intensity representation of the integrated circuit structure along the y-axis. In other words, the second derivative of a parabola that is fit to three or more points along the y-axis can be used to predict the curvature intensity representation of the integrated circuit structure. The curvature information provides a more accurate representation of the integrated circuit structure and therefore a more accurate determination of the integrated circuit structure threshold. The parabola can be fit to the curvature sampling points in any manner known in the art.

The sampling points along the x-axis used for determining the slope of the intensity representation of the integrated circuit structure define a first line segment. In one embodiment, seven sampling points are used along the x-axis; however, any number of sampling points can be used. In one embodiment, the points used for determining curvature define a second line segment perpendicular to the first line segment; however, a perpendicular orientation is not required. Many different sets points can be used to estimate the curvature of the intensity representation of the integrated circuit structure. For example, the curvature can be determined at a midpoint of the first line segment, at either end of the first line segment, at the point of maximum intensity, at the point of maximum slope, or at any other point along the first line segment. A grid pattern of sampling points can also be used to determine slope and/or curvature of the intensity representation of the integrated circuit structure.

Other types of curvature can be used rather than fitting a parabola to a set of three or more points and determining the second derivative of the points along the parabola. For example, Gaussian curvature can be used, the radius of a circle fitted to the intensity representation of the structure can be used, other types of curvature and other geometric shapes can also be used to determine curvature.

In one embodiment, information gained from the slope and curvature can be used to make corrections to the layout used for manufacturing the integrated circuit structure such that the structure resulting from the manufacturing process more closely resembles the intended resulting structures than it would otherwise. In one embodiment, circuit layout structures are segmented. The various segments of the circuit layout are modified to facilitate closer realization of the intended structures.

Segmenting an integrated circuit layout involves inserting additional vertices to create smaller sections of edges, or edge fragments. Predefined rules generally define where vertices should be added. For example, vertices are usually added so that there is no more than a maximum edge segment length between vertices. Vertices can also be added near particular types of vertices, such as adding vertices near corner vertices so that a corner is comprised of two short edge fragments.

If more vertices are added, more precise edge placement corrections can be made, but more OPC computations are performed. That is, increasing the granularity of edge segments increases the potential OPC accuracy, but decreases speed. Densely filled areas are likely to need more intricate edge placement correction than sparsely filled areas, so more vertices may be added to densely filled areas than to sparsely filled areas.

In one embodiment, design layout segment placement is modified, if necessary, in response to the threshold determined based on the curvature of the contour representation of the integrated circuit structure. For example, a line end segment of a layout can be moved so that the threshold of the modeled integrated circuit structure corresponds more closely to the end of the design layout.

FIGS. 4A-4F illustrate exemplary sampling patterns suitable for use with the invention. FIG. 4A illustrates a sampling pattern where the curvature line segment is located at the midpoint of the slope line segment. FIG. 4B illustrates a sampling pattern where the curvature line segment is located at the endpoint of the slope line segment. FIG. 4C illustrates a sampling pattern where the curvature line segment is located at a point between the end point and the midpoint. FIG. 4D illustrates a grid sampling pattern. FIG. 4E illustrates a sampling pattern where the curvature line segment is located at the point of maximum intensity along the slope line segment. FIG. 4F illustrates a sampling pattern where the curvature line segment is located at the point of maximum slope along the slope line segment. Other sampling patterns can also be used.

Figure 5:
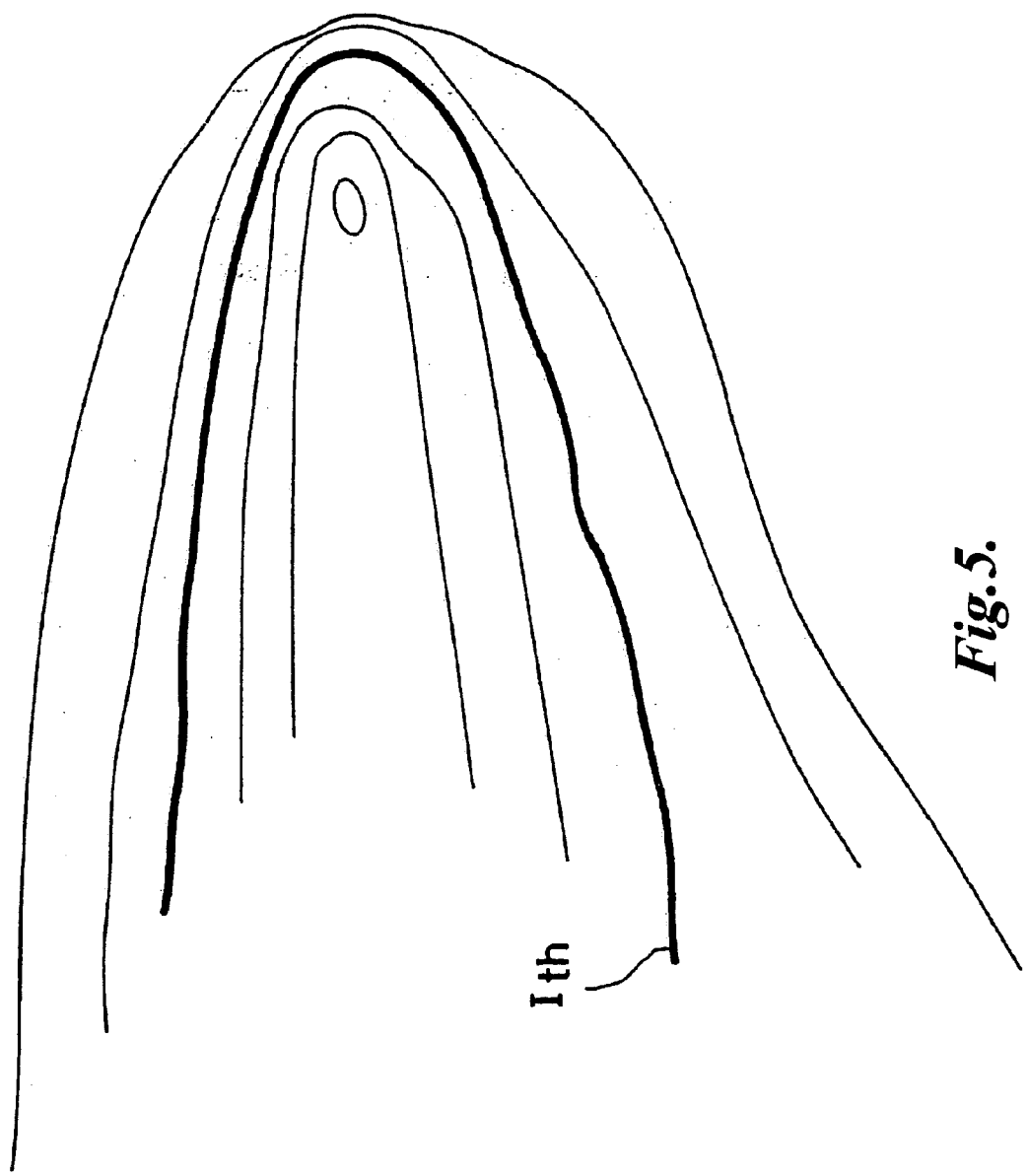
FIG. 5 illustrates one embodiment of a contour representation of a simulation result corresponding to an integrated circuit structure layout upon which curvature can be measured in a second manner.

FIG. 5 illustrates one embodiment of a contour representation of a simulation result corresponding to an integrated circuit structure layout upon which curvature can be measured in a second manner. In one embodiment, curvature is measured along a contour line, C. In such an embodiment, the intensity threshold can be measured as:

$$I_{th} = f\left(I_{max}, \left.\frac{\partial I}{\partial x}\right|_{max}, \left.\frac{\partial^2 I}{\partial y^2}\right|_{I=fixed}\right)$$

where $$\left.\frac{\partial^2 x}{\partial y^2}\right|_{I=fixed}$$

represents the curvature of the contour of the integrated circuit structure along a constant intensity contour. The curvature information can be used for OPC as described above.

Figure 6:
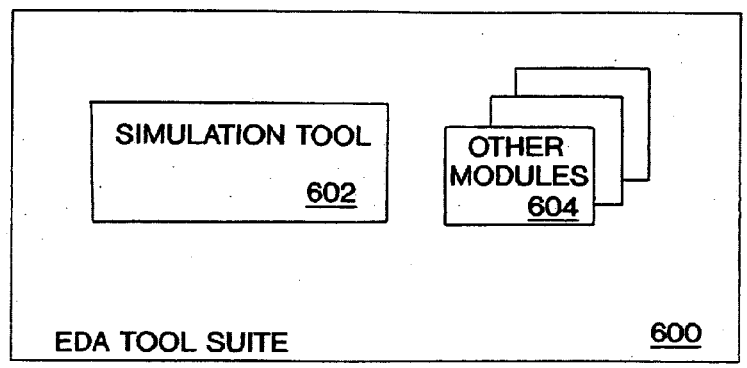
FIG. 6 illustrates an electronic design automation (EDA) tool that can be incorporated with the invention.

FIG. 6 illustrates an electronic design automation (EDA) tool that can be incorporated with the invention. As illustrated, EDA tool suite 600 includes simulation tool 602 incorporated with the teachings of the present invention as described earlier (e.g., VTR model 280 of FIG. 2). Additionally, EDA tool suite 600 includes other tool modules 604. Examples of these other tool modules 602 include but not limited to synthesis module, layout verification module and so forth.

Figure 7:
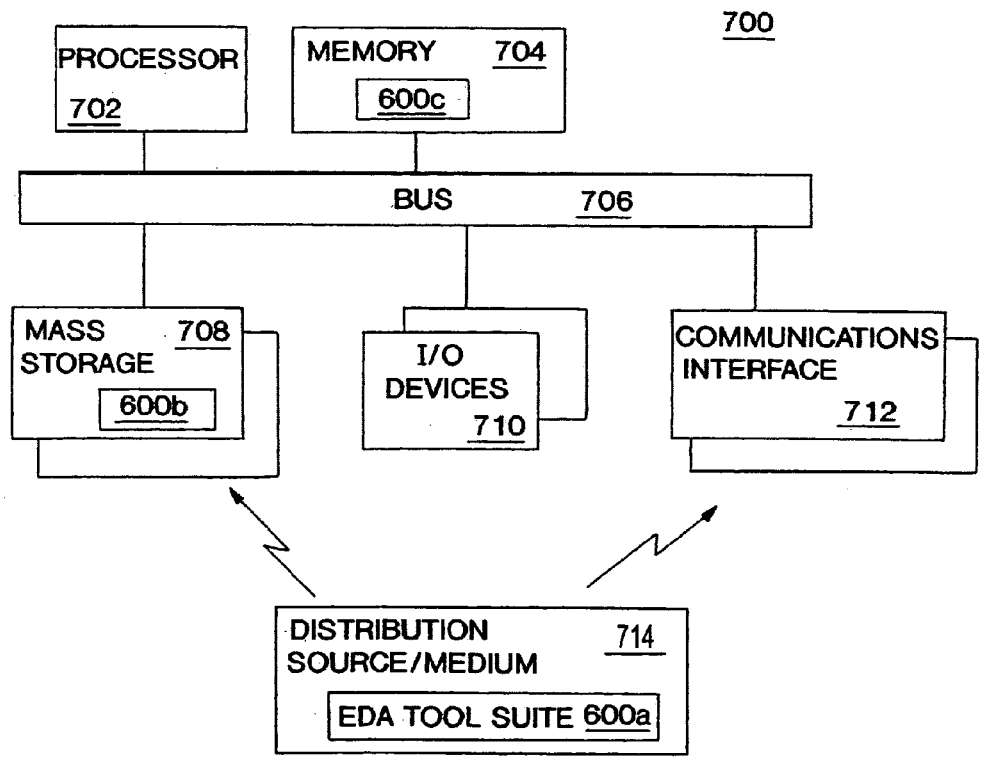
FIG. 7 illustrates one embodiment of a computer system suitable for use to practice the invention.

FIG. 7 illustrates one embodiment of a computer system suitable for use to practice the invention. As shown, computer system 700 includes processor 702 and memory 704 coupled to each other via system bus 706. Coupled to system bus 706 are non-volatile mass storage 708, such as hard disks, floppy disks, and so forth, input/output devices 710, such as keyboard, displays, and so forth, and communication interfaces 712, such as modem, LAN interfaces, and so forth. Each of these elements performs its conventional functions known in the art.

In particular, system memory 704 and non-volatile mass storage 708 are employed to store a working copy and a permanent copy of the programming instructions implementing the above described teachings of the present invention. System memory 704 and non-volatile mass storage 706 may also be employed to store the IC designs. The permanent copy of the programming instructions to practice the present invention may be loaded into non-volatile mass storage 708 in the factory, or in the field, using distribution source/medium 714 and optionally, communication interfaces 712. Examples of distribution medium 714 include recordable medium such as tapes, CDROM, DVD, and so forth. In one embodiment, the programming instructions are part of a collection of programming instructions implementing an EDA tool e.g., 600a, 600b, or 600c such as shown in FIG. 6. The constitutions of elements 702-714 are well known, and accordingly will not be further described.

Figure 8:
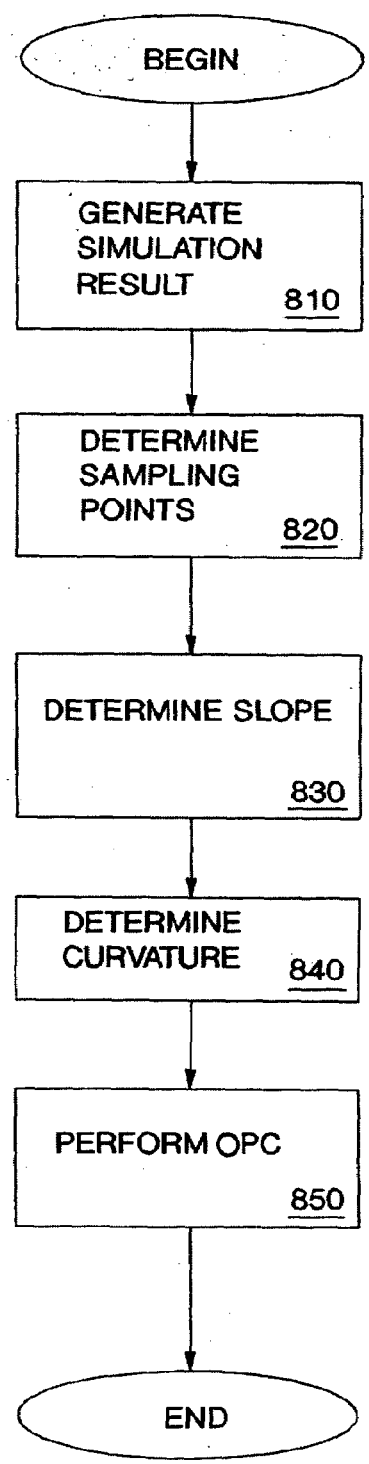
FIG. 8 a flow chart corresponding to one embodiment of OPC based on curvature.

FIG. 8 is a flow chart corresponding to one embodiment of OPC based on curvature. In one embodiment, the process of FIG. 8 is performed by an EDA tool based on an integrated circuit design layout. In an alternative embodiment, the process of FIG. 8 can be performed by a non-EDA application.

A simulation result such as an image of an integrated circuit structure layout is generated at 810. Generating the simulation result can be accomplished in any manner known in the art. Alternatively, a previously generated integrated circuit intensity pattern can be used instead.

Sampling points are determined at 820. In one embodiment, a set of sampling points (e.g., FIGS. 4A-4F) is applied to the contour of each design layout segment. In other words, samples are taken according to the chosen sampling pattern for the contour of each segment. In one embodiment, the x-axis sampling points described above are perpendicular to the contour of the design layout segment and the y-axis sampling points are parallel to or coincident with the contour of the layout segment. In alternative embodiments, sampling points are not necessarily orthogonal as described above, for example, the x-axis can be at an angle of 45° with respect to the contour of the layout segment.

Slope is determined at 830. In one embodiment, both the point of maximum intensity and the steepest slope (i.e., the pair of sampling points on the contour representation having the greatest slope therebetween) are determined. Curvature is determined at 840. Curvature can be determined according to any manner described above.

OPC is performed at 850. In one embodiment, layout for line segments can be modified to compensate for optical effects (e.g., line end shortening) that result in an integrated circuit structure closer to the designed integrated structure using the determined slope and curvature. The process of FIG. 8 can be repeated for the modified integrated circuit layout to improve results further.

As indicated above, computation of light intensity curvature of the simulated image can be used not only for determining the magnitude and direction of motion of an edge segment, but can also be used to change the fragmentation settings by changing the length of some edge segments and/or eliminating others.

This situation commonly arises when very fine fragmentation is initially selected for OPC. Here, high accuracy is desired, and so computations and edge motions on a very fine scale are desired, especially around corners of the polygons. However, applying a dense fragmentation setting throughout the layout can lead to excessive computation when many of these segments will actually yield the same result. For this, variable fragmentation is clearly desired—dense in some regions, sparse in others.

This variable fragmentation can be applied by conventional simplistic rules, such as the run length of a line. However, a more useful approach, in accordance with an aspect of the present invention, is to adapt the fragmentation using properties of the simulated image as a guide. Here, regions of high light intensity curvature in the simulation are regions in which dense fragmentation is desired, while regions with low light intensity curvature can have reduced fragmentation without a significant loss of accuracy.

A flow chart of one possible procedure for implementing dynamic fragmentation in accordance with the present invention is shown in FIG. 9 and FIGS. 10A-10E. The procedure is preferably implemented by a stand alone or distributed computer system that executes a series of programmed instructions received from a computer readable media such as a hard drive, CD-ROM, DVD, or from a wireless or wired communication link.

Beginning at 900, a layer of an integrated circuit or device to be created is selected. At 902, fragment curvature thresholds are selected above which edge segments should be more closely spaced, or conversely, below which edge segments can be spread farther out. At 904, each polygon in a layout is fragmented into a number of edge segments that are defined by a pair of endpoints. A control site is also defined for each edge segment at which the edge placement error (EPE) for the segment should be zero and where measurements of a process parameter for an edge segment are to be estimated. A cut line defines the angle of the control site with respect to the edge segment. Generally, the cut lines are perpendicular to the edge segment.

At 906, an aerial simulation of the fragmented polygons is performed and properties of the simulated image, such as light intensity curvature, are computed at each edge segment's control site.

Figure 11A:
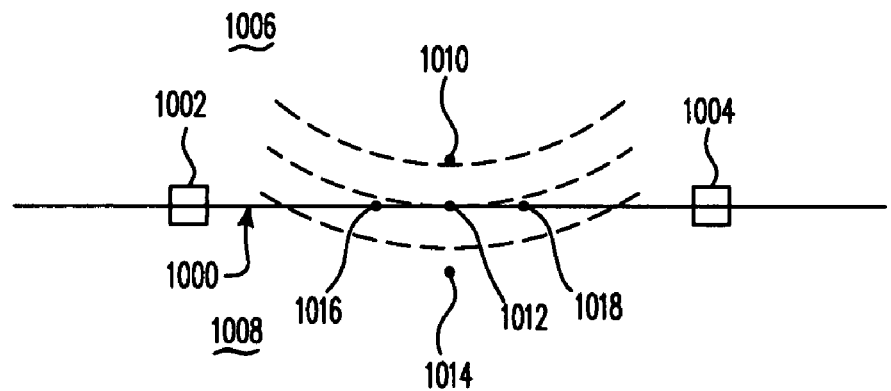
FIGS. 11A-11B illustrate one technique for calculating light intensity curvature at a control site.
Figure 11B:
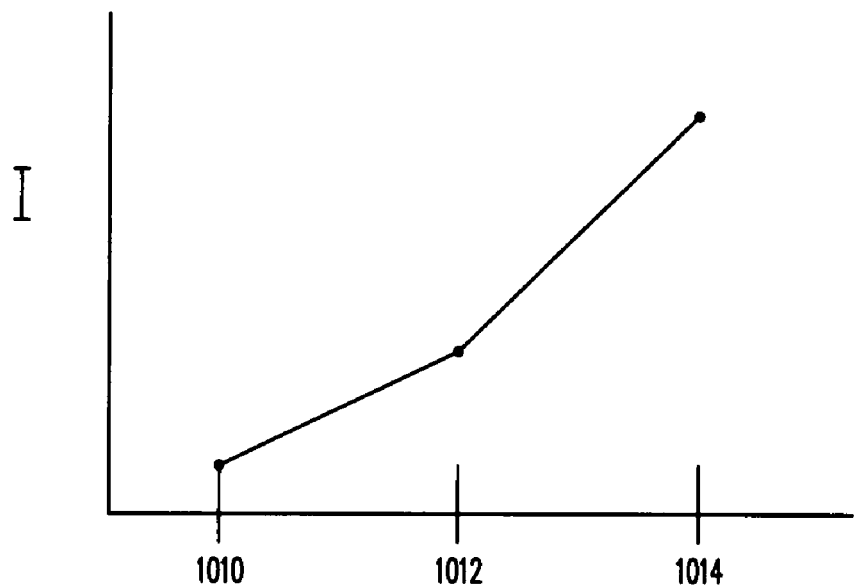

FIGS. 11A and 11B illustrate one method of estimating a process parameter such as light intensity curvature for an edge segment. In the example shown, an edge segment 1000 is defined by endpoints 1002, 1004. The edge segment defines a boundary of a polygon having an interior region 1006 and an exterior region 1008.

A control site is defined for the edge segment. The control site includes numerous sample points where process parameters are calculated in the region of the edge segment. The control site includes a target point 1012 and at least two other sample points 1010 and 1014 that are oriented in a direction that is generally normal to the edge segment. In addition, the control site includes at least two tangential sample points 1016, 1018 that are aligned with one of the sample points 1010, 1012, 1014. As will be appreciated, the control site may include more or fewer sample points that may be arranged in different patterns and/or angular orientations with respect to the edge segment 1000.

To estimate the light intensity curvature of the polygon in the area of the edge segment, the slope of the light intensity in a direction normal to the edge segment is first calculated.

FIG. 11B shows values of light intensity that may be calculated at the sample points 1010, 1012, 1014. For bright field masks where a polygon is created on a wafer by an area of chrome that blocks light, the light intensity generally increases with distance away from the edge of the polygon. Next, the curvature of the light intensity at the control site is determined by estimating the light intensity at the tangential sample points 1016, 1018. The tangential sample points can be aligned with any of the sample points 1010, 1012, or 1014 or anywhere in between. For example, the tangential sample points may be placed where the slope of the light intensity in the normal direction has a particular value or where the light intensity has a particular value, etc. To compute the light intensity curvature, the difference, $\Delta_1$, between the left tangential sample point 1016 and the center sample point 1012 is determined and the difference, $\Delta_2$, between the center sample point 1012 and the right tangential sample point 1018 is determined. The curvature is then defined as the difference $\Delta_1$-$\Delta_2$.

Although the present embodiment uses a 5-point control site, it will be appreciated that the sample site may include more sample points, if desired. Furthermore, alternative definitions for curvature could also be used.

At 908, a loop begins analyzing each edge segment defined in a layer. Beginning at 910, it is determined whether the light intensity curvature at the control site is below the threshold that was set at 902. If the answer at 910 is YES, then processing proceeds to 912, wherein it is determined if the curvature for a neighboring edge segment is below the threshold. If the answer at 912 is YES, then the edge segment in question is merged with a neighboring edge segment at 914. At 916, a new control site for the newly merged edge segment is selected and processing proceeds to 918. Processing also proceeds from 910 and 912 to 918 if the answer at either 910 or 912 is NO. At 920, the next edge segment to be analyzed is obtained and the process proceeds until all edge segments in the layer have been analyzed. At 922, the refragmented layer is analyzed using conventional OPC techniques.

Figure 10A:
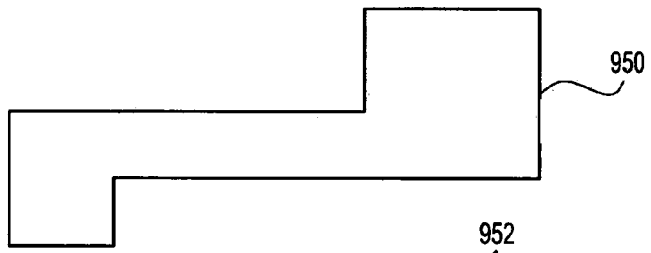
FIGS. 10A-10E illustrate a polygon that is refragmented as a function of simulated light intensity curvature in accordance with one embodiment of the present invention.
Figure 10B:
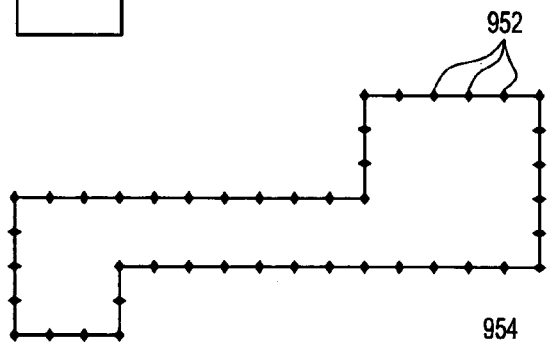
Figure 10C:
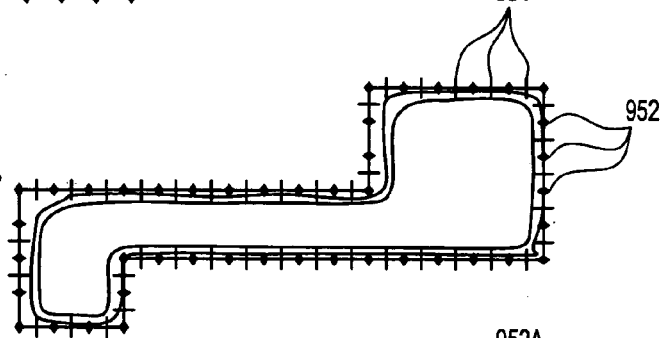

FIG. 10A shows a polygon 950 whereby dense fragmentation is initially applied throughout the layout in preparation for doing OPC (FIG. 10B). Control sites 952 and cut lines 954 are generated for each segment, and the simulated aerial image for the layout is computed. Using a suitable sampling plan, the light intensity curvature for each edge segment is computed (FIG. 10C).

Figure 10D:
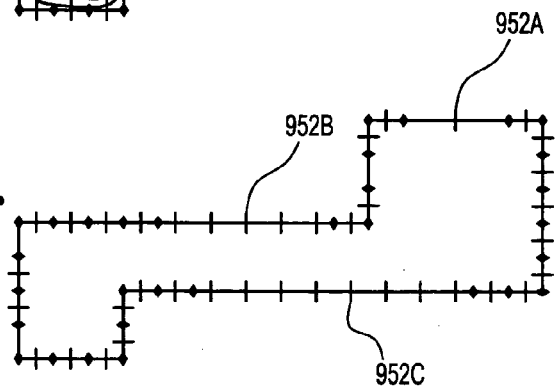
Figure 10E:
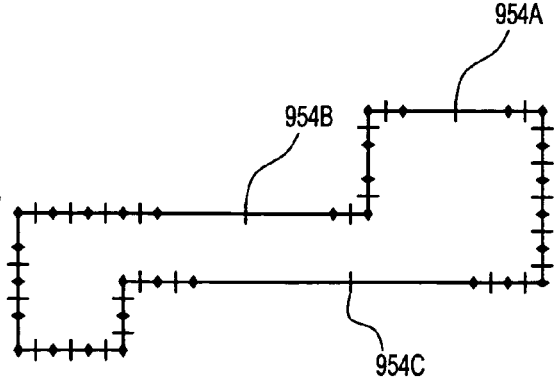

For contiguous edge segments in which the light intensity curvature is lower than the preset threshold, the endpoints between them can be eliminated, and new single edge segments 952A, 952B, 952C generated in place of the contiguous edge segments, as shown in FIG. 10D. New control sites 954A, 954B, 954C are then determined for the new edge segments as shown in FIG. 10E. OPC then continues as normal on the polygon with the revised fragmentation.

Although the disclosed embodiment of the invention has been described using an initially dense uniform fragmentation, it is also clear that prior art, rule-based variable fragmentation can be initially applied. Light intensity curvature is then used to further refine the fragmentation. In rule-based variable fragmentation, fragmentation points are typically added to polygons in areas where corners of adjacent polygons are projected onto the polygon in question.

Although the embodiment disclosed is used to reduce fragmentation that is too dense, computation of local light intensity curvature can also be used to locally enhance fragmentation, should the value for curvature be determined to be above a preset threshold for a particular edge segment.

It is also an aspect of this invention that re-fragmentation for curvature can be accomplished through the creation of "tags," as described in U.S. Pat. Nos. 6,249,904, 6,467,076, assigned to Mentor Graphics Corporation, the assignee of the present invention and are herein incorporated by reference. In this embodiment, light intensity curvature is evaluated and an edge segment is "tagged," i.e., a record is created that stores each edge segment's light intensity curvature value. Neighboring segments that are similarly "tagged," or tagged within a range of values, will then be merged. Alternatively, edge segments having a tag with a curvature value above a threshold can be divided into two or more smaller edge segments.

Figure 9:
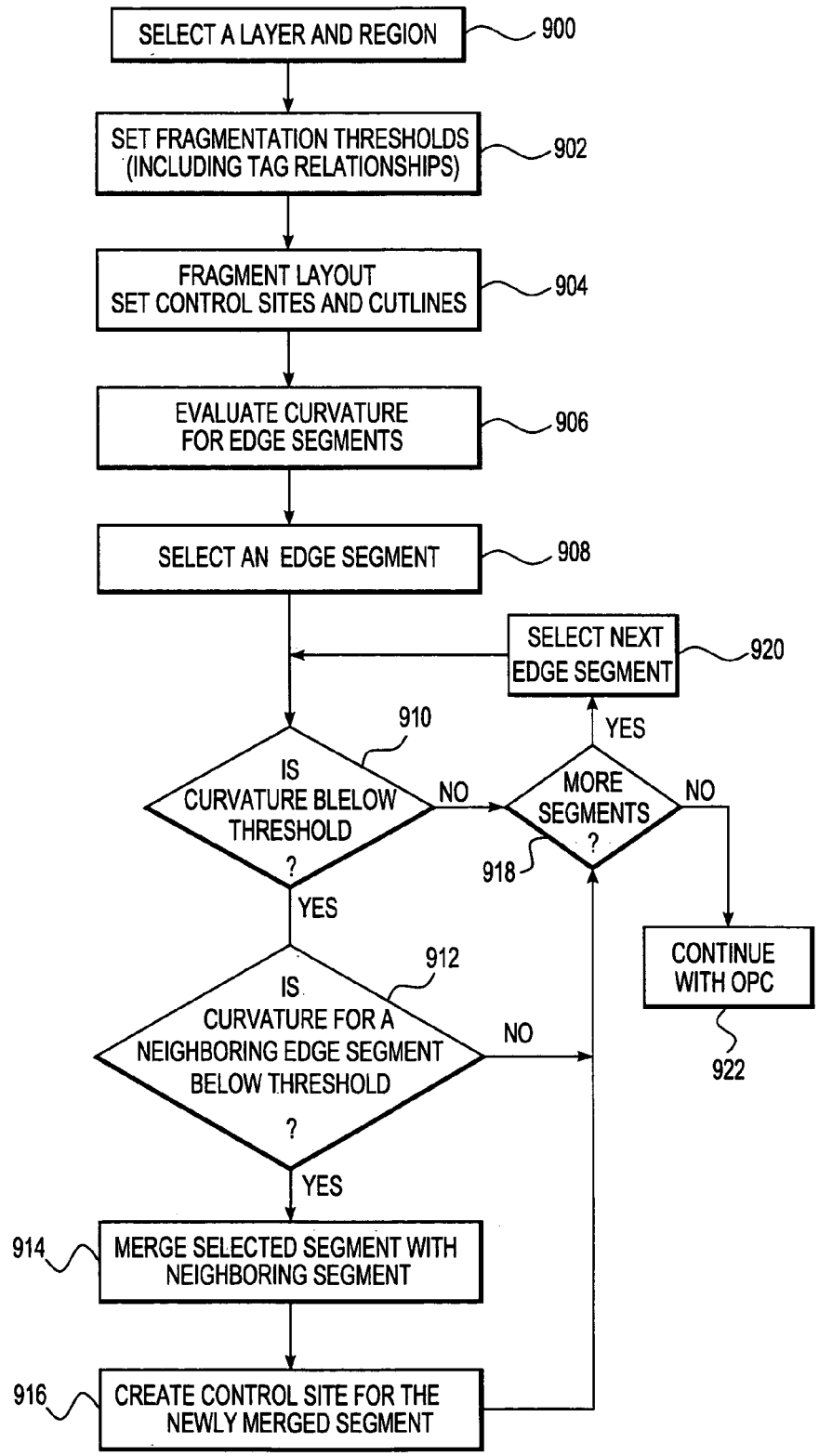
FIG. 9 illustrates one embodiment of a method of fragmenting an object as a function of a simulated process parameter such as the curvature of light intensity in accordance with one embodiment of the present invention.

Although the present embodiment of the invention has been described using the acts of merging the segments and reassigning new control points as part of the actions taken for each polygon as evaluation takes place, these edge segments can be simply identified during the iterative loop of FIG. 9, and the acts of merging and/or recreating control points can be deferred until all edge segments have been evaluated throughout the layout.

Therefore, although the invention has been described with reference to specific embodiments thereof, it will be evident that various modifications and changes can be made thereto without departing from the broader scope of the invention.

For example, it is clear that the curvature threshold for reducing or increasing fragmentation may be linked to tags that are applied to various edge segments. In other words, a region tagged as being a "dummy fill" or a "gate" may have different re-fragmentation rules (i.e., a lower or higher curvature threshold) than one that is untagged.

It is also possible to re-fragment polygons based on "tags" for computed properties other than curvature. This could include criteria such as segment length, proximity to other features, the difference in intensity gradient angles between two sites or the intensity slope in a direction parallel to or tangent to the edge segment (i.e. $1^{st}$ derivative as opposed to the curvature in the parallel or tangent direction that is the $2^{nd}$ derivative), or using statistical processing criteria associated with an edge segment (MEEF values, allowed linewidth variation, etc.) as well.

In the majority of applications, a file containing a layer description is fragmented and then refragmented by computing a simulation property on a local computer. However, it will be appreciated that the present invention also encompasses a file that describes a layer of an integrated circuit or other device to be created lithographically that has been refragmented in accordance with a simulated property that is computed at a remote computer, which may be located domestically or internationally. The refragmented file is received from the remote computer by a wired or wireless communication link or on a computer readable media and is used to create masks for use in a lithographic process.

Therefore, the specification and drawings are, accordingly, to be regarded in an illustrative rather than a restrictive sense and the scope of the invention is to be determined from the following claims and equivalents thereto.

The embodiments of the invention in which an exclusive property or privilege is claimed are defined as follows:

1. A method of preparing circuit layout data for the application of optical and process correction (OPC), comprising:

receiving data that represents a layer of an integrated circuit that is defined as a number of polygons;

fragmenting a polygon into a number of edge segments by defining a number of fragmentation endpoints that extend around the perimeter of the polygon;

defining control sites for the edge segments;

computing a simulation of the layout that estimates light intensity values in an area corresponding to a control site of at least one of the edge segments;

calculating a curvature of the light intensity in a direction parallel to the at least one edge segment at the control site; and using the curvature of the light intensity to adjust the number of fragmentation endpoints on the perimeter of the polygon.

2. The method of claim 1, wherein the number of fragmentation endpoints is adjusted by:

adding one or more fragmentation endpoints to the perimeter of the polygon if the curvature of the light intensity calculated at a position corresponding to a control site for an edge segment is greater than a predetermined threshold.

3. The method of claim 1, wherein the number of fragmentation endpoints is adjusted by:

calculating a curvature of the light intensity at a position corresponding to the control site and in a direction parallel to an adjacent edge segment; and removing one or more fragmentation endpoints from the perimeter of the polygon if the curvature of the light intensity calculated at a position of the control sites defined for adjacent edge segments is less than a predetermined threshold.

4. A computer storage medium including a sequence of program instructions recorded thereon that, when executed by one or more processors, cause the one or more processors to implement the method of any of claims 1-3.

5. A method for preparing data that describes a layout of an integrated circuit by:

fragmenting polygons that describe structures to be created via photolithography;

performing an initial fragmentation that divides a polygon into a number of edge segments that extend around the perimeter of the polygon;

defining control sites for the edge segments;

computing a simulation of a curvature of an image intensity at a location on a wafer corresponding to a control site in a direction parallel to an edge segment under defined process conditions; and using the results of the simulation to adjust the fragmentation of the polygon to add fragmentation endpoints on the perimeter of the polygon areas where the curvature of the image intensity is greater than a predetermined amount and/or to remove fragmentation endpoints on the perimeter of the polygon where the curvature of the image intensity is less than a predetermined amount.

6. A computer storage medium that stores a sequence of program instructions that when executed by one or more computers cause the one or more computers to implement the method of claim 5.

* * * * *

UNITED STATES PATENT AND TRADEMARK OFFICE
CERTIFICATE OF CORRECTION

PATENT NO. : 7,324,930 B2 Page 1 of 1
APPLICATION NO. : 10/696276
DATED : January 29, 2008
INVENTOR(S) : Nicolas B. Cobb It is certified that error appears in the above-identified patent and that said Letters Patent is hereby corrected as shown below:

On page 2, col. 1, line 11:

Other Publications, "(JIIIA)" should read --(J111A)--.

In the Specification:

Column 8, line 32, " $\frac{\partial^2 I}{\partial y^2}$ " should read -- $\frac{\partial^2 x}{\partial y^2}$ --.

Signed and Sealed this

Sixth Day of April, 2010

David J. Kappos
*Director of the United States Patent and Trademark Office*